(12) United States Patent
Farmer et al.

(10) Patent No.: US 8,766,345 B2
(45) Date of Patent: Jul. 1, 2014

(54) AREA-EFFICIENT CAPACITOR USING CARBON NANOTUBES

(71) Applicant: International Business Machines Corporation, Armonk, NY (US)

(72) Inventors: Damon B. Farmer, White Plains, NY (US); Aaron D. Franklin, Croton on Hudson, NY (US); Shu-Jen Han, Cortlandt Manor, NY (US); George S. Tulevski, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/690,593

(22) Filed: Nov. 30, 2012

(65) Prior Publication Data

US 2014/0151847 A1    Jun. 5, 2014

(51) Int. Cl.
*H01L 27/108* (2006.01)
*H01L 29/76* (2006.01)
*H01L 29/94* (2006.01)
*H01L 31/119* (2006.01)

(52) U.S. Cl.
USPC .... 257/303; 257/306; 257/310; 257/E27.086; 257/E27.092; 257/E29.346

(58) Field of Classification Search
USPC ............. 257/296, 301, 303, 306, 309, 310, 257/E27.086, E27.092, E29.346
See application file for complete search history.

(56) References Cited

U.S. PATENT DOCUMENTS

| | | | |
|---|---|---|---|
| 6,515,325 B1 | 2/2003 | Farnworth et al. | |
| 6,995,416 B2 * | 2/2006 | Reisinger et al. | 257/296 |
| 7,244,983 B2 | 7/2007 | Kim et al. | |
| 7,767,537 B2 | 8/2010 | Cheng | |
| 8,222,104 B2 | 7/2012 | Booth, Jr. et al. | |

OTHER PUBLICATIONS

P. Banerjee, et al., "Nanotubular Metal-Insulator-Metal Capacitor Arrays for Energy Storage," Nature Nanotechnology, vol. 4, 2009, pp. 292-296.
M. Budnik, et al., "A High Density, Carbon Nanotube Capacitor for Decoupling Applications," Proceedings of the 43rd Annual Design Automation Conference, Jul. 2006, pp. 935-938.
A. Nieuwoudt, et al., "High Density Integrated Capacitors Using Multi-Walled Carbon Nanotubes," 7th IEEE Conference on Nanotechnology, IEEE-NANO 2007, Aug. 2-5, 2007, pp. 387-390.
J. Sohn, et al., "Fabrication of High-Density Arrays of Individually Isolated Nanocapacitors Using Anodic Aluminum Oxide Templates and Carbon Nanotubes," Applied Physics Letters, vol. 87, No. 12, 2005, 123115, 3 pages.

* cited by examiner

*Primary Examiner* — Hoai V Pham
(74) *Attorney, Agent, or Firm* — Cantor Colburn LLP; Vazken Alexanian

(57) ABSTRACT

An on-chip decoupling capacitor is disclosed. One or more carbon nanotubes are coupled to a first electrode of the capacitor. A dielectric skin is formed on the one or more carbon nanotubes. A metal coating is formed on the dielectric skin. The dielectric skin is configured to electrically isolate the one or more carbon nanotubes from the metal coating.

18 Claims, 5 Drawing Sheets

US 8,766,345 B2

AREA-EFFICIENT CAPACITOR USING CARBON NANOTUBES

BACKGROUND

The present invention relates to integrated chip capacitors, and more specifically, to capacitors using carbon nanotubes.

Integrated chips generally include on-chip decoupling capacitors to suppress voltage spikes and other electrical disturbances from destroying the operative elements of the integrated chip. On-chip decoupling capacitors generally include a first electrode and a second electrode having a dielectric material formed in between. The capacitance is generally affected by the materials used, the surface area between the first electrode and second electrode and the distance between the electrodes. A common method of increasing capacitance includes increasing the surface area between the electrodes. In one method, a trench may be formed in the first electrode and the second electrode is formed into a prong that extends into the trench. Also, several of these trench/prong architectures may be linked to extend the surface area between the first and second electrodes.

SUMMARY

According to one embodiment of the present invention, an on-chip decoupling capacitor includes: one or more carbon nanotubes coupled to a first electrode of the capacitor; a dielectric skin formed on the one or more carbon nanotubes; and a metal coating formed on the dielectric skin, wherein the dielectric skin is configured to electrically isolate the one or more carbon nanotubes from the metal coating.

According to another embodiment of the present invention, an integrated chip includes: a first electrode; a second electrode; and a separation layer between the first electrode and the second electrode, wherein the separation layer is configured to include one or more carbon nanotubes having a dielectric skin on their surfaces.

According to another embodiment of the present invention, an on-chip decoupling capacitor includes: a first electrode configured to form a plurality of trenches; a second electrode configured to form a plurality of prongs, wherein a selected prong of the second electrode is configured to extend into a selected trench of the first electrode; a separation layer between a first electrode and a second electrode, wherein the separating layer includes: a mesh of carbon nanotubes electrically coupled to the first electrode; a dielectric skin formed on the mesh of carbon nanotubes; and a metal coating formed on the dielectric skin.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
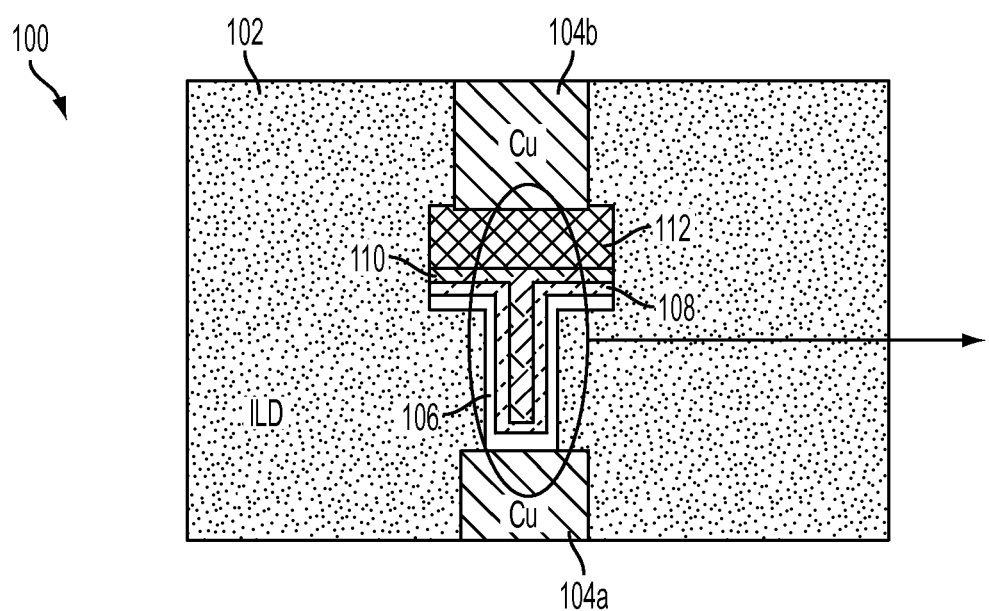
FIG. 1 shows an exemplary on-chip decoupling capacitor of the present invention that may be suitable for use in an integrated chip.

FIG. 1 shows an exemplary on-chip decoupling capacitor 100 of the present invention that may be suitable for use in an integrated chip. The on-chip decoupling capacitor 100 includes two copper wires 104a and 104b disposed within an interlayer dielectric material layer 102. The interlayer dielectric material layer 102 electrically isolates the capacitor 100 from outside circuitry and elements and prevents current leakage from the capacitor 100. The first copper wire 104a is electrically coupled to a bottom electrode 106, and the second copper wire 104b is electrically coupled to a top electrode 110 via a top metal layer 112. The bottom electrode 106 and the top electrode 110 may form a trench/prong architecture that increases a surface area between the bottom electrode 106 and the top electrode 110. A separation layer 108 is disposed between the bottom electrode 106 and the top electrode 110 to electrically isolate the bottom electrode 106 from the top electrode 110. In an exemplary embodiment, the separation layer 108 includes one or more carbon nanotubes that are arranged to increase a surface area of the separation layer 108 that relates to capacitance, and thus to increase the capacitance of the decoupling capacitor 100 over that of a separation layer without carbon nanotubes. Details of the separation layer 110 are discussed below with respect to FIGS. 2 and 3.

Figure 2:
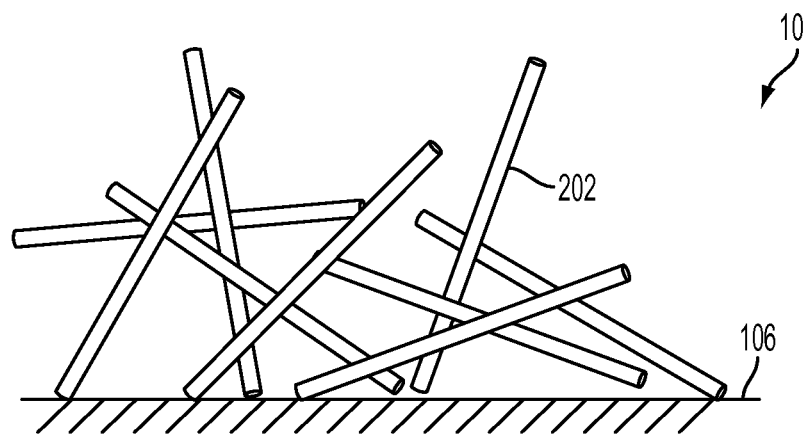
FIG. 2 shows an exemplary configuration of carbon nanotubes used in forming the exemplary separation layer of the on-chip decoupling capacitor of FIG. 1.

FIG. 2 shows an exemplary configuration of carbon nanotubes 202 used in forming the exemplary separation layer 108 of the on-chip decoupling capacitor 100 of FIG. 1. Bottom electrode 106 is shown and the separation layer 110 is represented by the volume above the surface of the bottom electrode 106. Carbon nanotubes 202 are deposited on the bottom electrode 106 and, in an exemplary embodiment, form a mesh of carbon nanotubes 202. The carbon nanotubes 202 may contact each other at various locations but otherwise establish a space therebetween due to their mesh-like arrangement or structure. Once the carbon nanotubes 202 are deposited, a dielectric skin (204, FIG. 3) may be formed on the carbon nanotubes 202. Due to the mesh-like structure of the deposited carbon nanotubes 202, atomic layer deposition may be used to deposit the dielectric skin 204 on the carbon nanotubes 202. The deposited dielectric skin 204 covers the outer surfaces of the carbon nanotubes 202 as well as the surface of the bottom electrode 106. Once the dielectric skin 204 is deposited on the carbon nanotubes 202, a metal coating (206, FIG. 3) may be deposited on the dielectric skin 204. The metal coating 206 may be deposited using atomic layer deposition techniques to form a substantially cylindrical shell about the skin.

Figure 3:
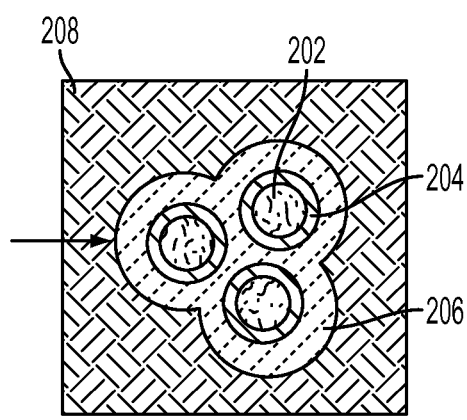
FIG. 3 shows a cross-sectional view of an exemplary separation layer of in FIG. 1.

FIG. 3 shows a cross-sectional view of an exemplary formed separation layer 108 of in FIG. 1. Exemplary carbon nanotubes 202 have a dielectric skin 204 formed on a surface of the carbon nanotube 202. The dielectric skin 204 is formed over the outer surface of the carbon nanotube 202 and may include $Al_2O_3$, $HfO_2$ or other suitable dielectric material. The thickness of the dielectric skin may be in a range between about 5 nanometers (nm) and 20 nm. In an exemplary embodiment, the dielectric skin 204 includes 1 nm of $AlO_2N_3$ and 8 nm of $HfO_2$. Metal coating 206 is formed on the outer surface of the dielectric skin 204 and may form a concentric layer around the dielectric skin 204. Additionally, the metal coating 206 may fill in gaps between the carbon nanotube/ dielectric skin assemblies. In an exemplary embodiment, the metal coating 206 has a thickness range between about 5 nm to 50 nm. The metal coating 206 may be tantalum nitride (TaN) or titanium nitride (TiN). In alternate embodiments, the metal layer 206 may include any suitable conductive metal such as copper, aluminum, etc. The remainder of the separation layer 108 not filled by the carbon nanotubes 202, the dielectric skin 204 and the metal coating 206 may be filled in with a suitable conductive material 208, such as copper, aluminum, etc. Once the separation layer 108 is formed, the dielectric skin 204 electrically isolates the carbon nanotube 202 from the metal coating 206. Therefore, the capacitance is defined on a nanoscale by the carbon nanotubes 202, the metal coatings 206 of the carbon nanotubes 202 and the dielectric skin 204 between the carbon nanotubes 202 and the metal coating 206. The surface area of the dielectric skin 204 therefore is related to the capacitance.

Figure 4:
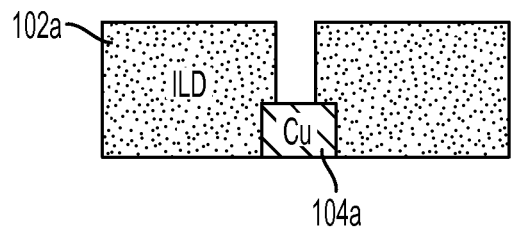
FIG. 4 shows a copper wire disposed in a trench formed in a bottom layer of interlayer dielectric material.

FIGS. 4-9 illustrate an exemplary manufacturing process for producing the exemplary on-chip decoupling capacitor 100 of the present invention. FIG. 4 shows a copper wire 104a disposed in a trench formed in a bottom dielectric layer 102a of interlayer dielectric material. In an exemplary embodiment, the interlayer dielectric material may be deposited on a top surface of the copper wire 104a. Chemical mechanical polishing may be performed to provide a smooth surface of the bottom dielectric layer 102a. Standard photolithographic methods and reactive ion etching may be used to reveal a top surface of the copper wire 104a.

Figure 5:
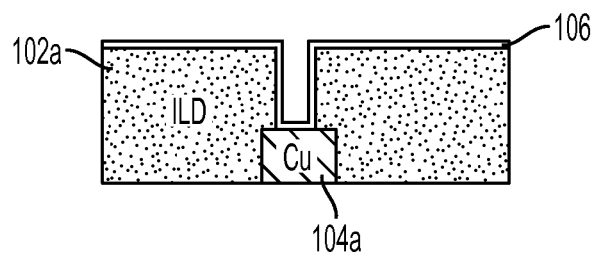
FIG. 5 shows a bottom electrode formed on the copper wire and bottom dielectric layer of FIG. 4.

FIG. 5 shows a bottom electrode 106 formed on the copper wire 104a and bottom dielectric layer 102a of FIG. 4. The bottom electrode 106 may be made of any suitable conductive metal such as copper or aluminum. In an exemplary embodiment, the bottom electrode 106 may be deposited using atomic layer deposition (ALD) or chemical vapor deposition (CVD) and may form a trench that conforms to the shape of the trench formed in FIG. 4.

Figure 6:
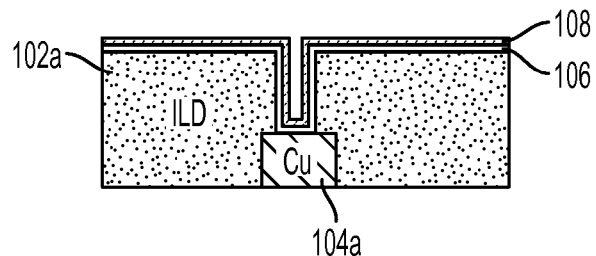
FIG. 6 shows a separation layer deposited on the bottom electrode of FIG. 5.

FIG. 6 shows a separation layer 108 deposited on the bottom electrode 106. The deposition of the separation layer 108 may be performed in several stages. As illustrated in FIG. 2, in a first stage one or more carbon nanotubes 202 are deposited on the bottom electrode 106, thereby adhering to the bottom electrode 106. In a second stage, a high-k dielectric material 204 is deposited on the carbon nanotubes 202 in order to cover the surface of the carbon nanotubes 202 and the bottom electrode 106. The dielectric skin 204 may have a thickness in a range from about 5 nm to about 20 nm. In an exemplary embodiment, the dielectric skin 204 may be about 9 nm in thickness, including about 1 nm of $AlO_2N_3$ and about 8 nm of $HfO_2$. The high-k dielectric material 204 may be deposited using atomic layer deposition or other suitable deposition process. In a third stage, a metal coating 206 is deposited to surround the carbon nanotubes 202 and their dielectric skins 204 formed thereon to obtain the exemplary configuration of FIG. 3. The metal coating 206 may be deposited using atomic layer deposition and may include any suitable conductive metal such as copper, aluminum, tantalum nitride (TaN), etc. The metal coating 206 may be about 5 nm to 50 nm thickness of TaN. A conductive metal 208 such as copper or aluminum, for example, may then be deposited to fill out the separation layer 108. The conductive metal 208 may be the same material as the metal coating 206. In an exemplary embodiment, the shape of the separation layer 108 substantially conforms to the bottom electrode 106, therefore maintaining the trench geometry established by the bottom electrode 106.

Figure 7:
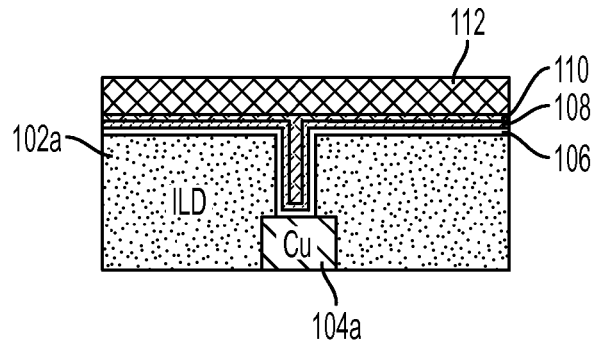
FIG. 7 shows a top electrode and a top metal deposited on the separation layer of FIG. 6.

FIG. 7 shows a top electrode 110 and a top metal layer 112 deposited on the separation layer 108. The top electrode 110 may be deposited using atomic layer deposition or chemical vapor deposition, or other suitable method. The top electrode 110 may be deposited to fill the trench formed by the bottom electrode 106 and the separation layer 108. In an exemplary embodiment, the top electrode 110 is the same material as the metal coating 206. Therefore, the deposition of the top electrode 110 may occur in the same step as the deposition of the metal coating 206. The top electrode 110 thus is electrically coupled to the metal coating 206 of the separation layer 108 while the bottom electrode 106 may be electrically coupled to the carbon nanotubes 202 of the separation layer 108. The top electrode 110 may include any suitable conductive metal such as copper aluminum, tantalum nitride, titanium nitride, etc. Top metal layer 112 may be deposited on the top electrode 110 once the top electrode deposition step is completed. The top metal layer 112 may include any suitable conductive metal such as copper aluminum, tantalum nitride, titanium nitride, etc.

Figure 8:
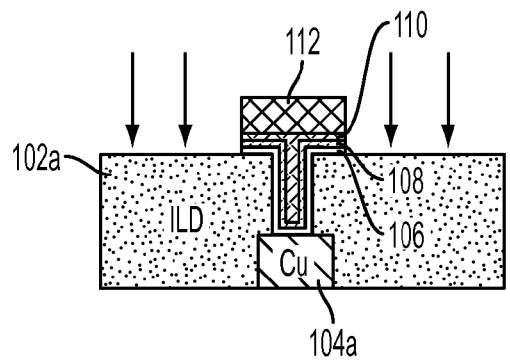
FIG. 8 shows an etched surface of a capacitive cell of the decoupling capacitor.

FIG. 8 shows an etched surface of a capacitive cell of the decoupling capacitor. An etching process removes the sections of the bottom electrode 106, separation layer 108, top electrode 110 and top metal layer 112 that are away from the trench region. The etched surface may be formed using standard photolithographic methods and reactive ion etching to reveal a top surface of the bottom dielectric layer 102a.

Figure 9:
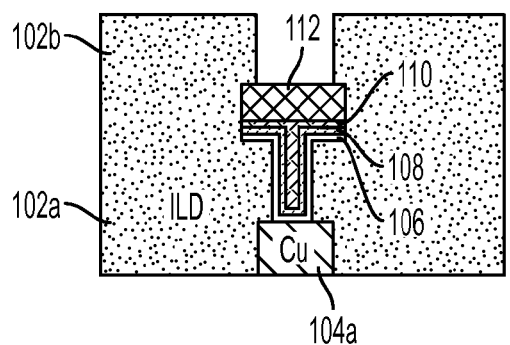
FIG. 9 shows a second layer of interlayer dielectric material that is deposited on the top surface of the capacitive cell formed in FIG. 8.

FIG. 9 shows a top dielectric layer 102b of interlayer dielectric material that is deposited on the top surface of the capacitive cell formed in FIG. 8. The interlayer dielectric material may be deposited on a top surface of the top metal layer 112 to form the top dielectric layer 102b. Chemical mechanical polishing may be performed on the deposited interlayer dielectric material to provide a smooth surface of the top dielectric layer 102b. Standard photolithographic methods and reactive ion etching may be used to reveal a top surface of the top metal layer 112. The top dielectric layer 102b and the bottom dielectric layer 102a together form the interlayer dielectric material layer 102 shown in FIG. 1.

Figure 10:
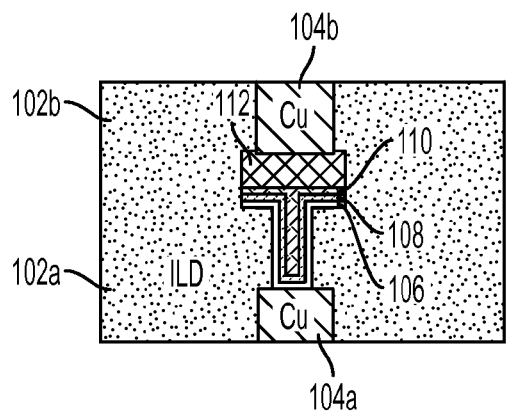
FIG. 10 shows a completed on-chip decoupling capacitor.

FIG. 10 shows a completed on-chip decoupling capacitor. A copper wire 104b is formed in the trench formed in FIG. 9 to complete the decoupling capacitor. In an exemplary embodiment, the copper wire 104b may be formed by copper deposition and chemical mechanical polishing. The completed capacitor includes the top electrode 110, the bottom electrode 106 and the separation layer 108. Within the separation layer, the capacitance is formed via the metal coating 206, the carbon nanotubes 202 and the dielectric skin 204. Thus, the area that determines the capacitance of the capacitor is related to the surface area of the dielectric skin 204 in the separation layer 108. This capacitive area is greater than an area that would be provided by a separation layer without the carbon nanotubes 202. Therefore, the presence of the carbon nanotubes 202 increases the capacitance over that of a capacitor without the carbon nanotubes in the separation layer 108.

Figure 11:
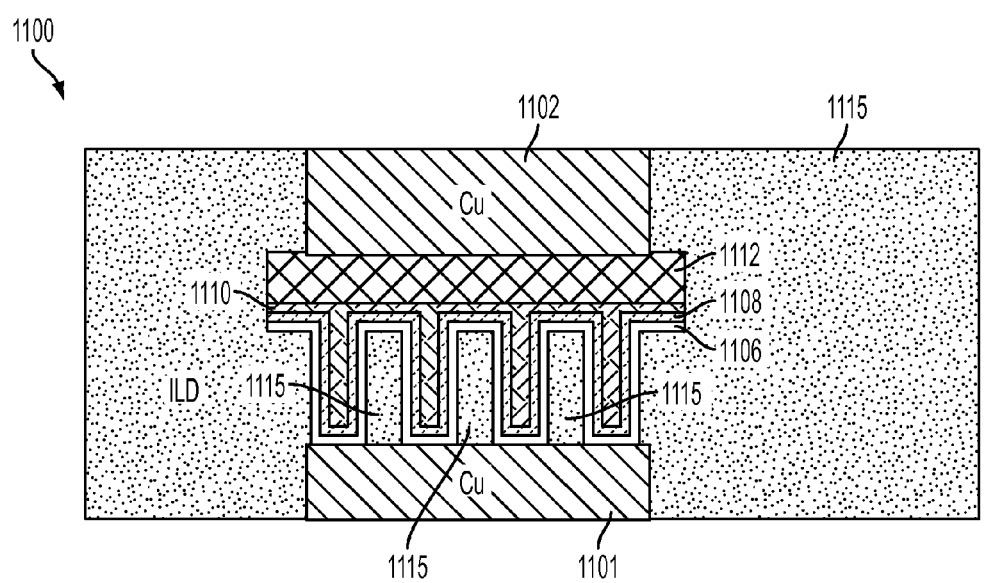
FIG. 11 shows a single decoupling capacitor that includes a plurality of trenches.

FIG. 11 shows a single decoupling capacitor that includes a plurality of trenches. The interlayer dielectric material layer 1115 may be etched to form a number of trenches on the copper wire 1101. Bottom electrode 1106, separation layer 1108, top electrode 1110, top metal layer 1112 and top copper wire 1102 may be formed on the copper wire 1101 using the method illustrated in FIG. 4-10. Each trench of the decoupling capacitor 1100 adds surface area to the capacitor and thus increases the capacitance of the decoupling capacitor 1110. Although the exemplary decoupling capacitors disclosed herein (i.e., the capacitors of FIGS. 1 and 11) are formed within an interlayer dielectric material, in alternate embodiments a capacitor may be formed within other suitable materials such as silicon, for example.

Although the terms "top" and "bottom" have been used with respect to the decoupling capacitor to describe a layered structure of the capacitor, it is understood that these terms are used for illustrative purposes and that the decoupling capacitor may be directed along any selected orientation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An on-chip decoupling capacitor, comprising:
   one or more carbon nanotubes coupled to a first electrode, wherein the first electrode is configured to include at least on trench;
   a dielectric skin formed on the one or more carbon nanotubes;
   a metal coating formed on the dielectric skin, wherein the dielectric skin is configured to electrically isolate the one or more carbon nanotubes from the metal coating; and
   a second electrode forming at least one prong that is configured to extend into the at least one trench of the first electrode.

2. The on-chip decoupling capacitor of claim 1, wherein the one or more carbon nanotubes are electrically coupled to the first electrode of the capacitor and the metal coating is electrically coupled to the second electrode of the capacitor.

3. The on-chip decoupling capacitor of claim 1, wherein a capacitance of the capacitor is directly proportional to a surface area of the dielectric skin.

4. The on-chip decoupling capacitor of claim 1, wherein the capacitance of the capacitor is directly proportional to a number of carbon nanotubes.

5. The on-chip decoupling capacitor of claim 1 wherein the carbon nanotube is a metal-rich carbon nanotube.

6. The on-chip decoupling capacitor of claim 1, wherein the one or more carbon nanotubes are configured to form a mesh-like structure on the first electrode and the metal coating is configured to fill a gap between the one or more carbon nanotubes in the mesh-like structure.

7. The on-chip decoupling capacitor of claim 1, wherein a thickness of the dielectric skin is between about 5 nanometers (nm) and 10 nm.

8. An integrated chip, comprising:
   a first electrode configured to form at least one trench;
   a second electrode configured to form at least one prong that extends into the at least one trench of the first electrode; and
   a separation layer between the first electrode and the second electrode, wherein the separation layer is configured to include one or more carbon nanotubes having a dielectric skin on their surfaces.

9. The integrated chip of claim 8 further comprising a metal coating formed on the dielectric skin, wherein the dielectric skin electrically is configured to electrically insulate the one or more carbon nanotube from the metal coating.

10. The integrated chip of claim 9, wherein the carbon nanotubes are configured to electrically couple to the first electrode and the metal coating is configured to electrically couple to the second electrode.

11. The integrated chip of claim 9, wherein the one or more carbon nanotubes are configured to form a mesh-like structure on the first electrode and the metal coating is configured to fills a gap between the one or more carbon nanotubes in the mesh-like structure.

12. The integrated chip of claim 8, wherein a capacitance between the one or more carbon nanotubes and the metal coating is directly proportional to a surface area of the dielectric skin.

13. The integrated chip of claim 8 wherein the carbon nanotube is a metal-rich carbon nanotube.

14. An on-chip decoupling capacitor, comprising:
a first electrode configured to form a plurality of trenches;
a second electrode configured to form a plurality of prongs, wherein a selected prong of the second electrode is configured to extend into a selected trench of the first electrode;
a separation layer between a first electrode and a second electrode, wherein the separating layer comprises:
a mesh of carbon nanotubes electrically coupled to the first electrode;
a dielectric skin formed on the mesh of carbon nanotubes; and
a metal coating formed on the dielectric skin.

15. The on-chip decoupling capacitor of claim 14, wherein the mesh of carbon nanotubes is configured to electrically couple to the first electrode and the metal coating is configured to electrically couple to the second electrode.

16. The on-chip decoupling capacitor of claim 14, wherein a capacitance of the capacitor is directly proportional to a surface area of the dielectric skin.

17. The on-chip decoupling capacitor of claim 14 wherein the mesh of carbon nanotubes includes a metal-rich carbon nanotube.

18. The on-chip decoupling capacitor of claim 14, wherein the bottom electrode is configured to couple to a copper wire at a plurality of locations.

* * * * *